(12) United States Patent
Lee et al.

(10) Patent No.: US 11,824,282 B2
(45) Date of Patent: Nov. 21, 2023

(54) ANTENNA ELEMENT, ANTENNA DEVICE AND DISPLAY DEVICE INCLUDING THE SAME

(71) Applicant: DONGWOO FINE-CHEM CO., LTD., Jeollabuk-do (KR)

(72) Inventors: Won Hee Lee, Incheon (KR); Jae Hyun Lee, Gyeonggi-do (KR); Byung Jin Choi, Incheon (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 117 days.

(21) Appl. No.: 17/518,780

(22) Filed: Nov. 4, 2021

(65) Prior Publication Data

US 2022/0140482 A1 May 5, 2022

(30) Foreign Application Priority Data

Nov. 5, 2020 (KR) ........................ 10-2020-0146958

(51) Int. Cl.
*H01Q 9/04* (2006.01)
*H05K 1/02* (2006.01)

(52) U.S. Cl.
CPC ........... *H01Q 9/045* (2013.01); *H05K 1/0243* (2013.01); *H05K 2201/10098* (2013.01)

(58) Field of Classification Search
CPC ........ H01Q 1/22; H01Q 1/38–48; H01Q 9/04; H05K 2201/10098
See application file for complete search history.

(56) References Cited

U.S. PATENT DOCUMENTS

2020/0201470 A1* 6/2020 Oh ........................ G06F 3/0412
2020/0259245 A1* 8/2020 Kim ...................... H01Q 1/243
2020/0259246 A1* 8/2020 Kim ...................... H01Q 21/28

FOREIGN PATENT DOCUMENTS

JP 7-176942 A 7/1995
KR 10-2012-0052784 A 5/2012

* cited by examiner

*Primary Examiner* — Hasan Islam
(74) *Attorney, Agent, or Firm* — The PL Law Group, PLLC

(57) ABSTRACT

An antenna element according to an embodiment includes a radiation body formed in a mesh structure, a first transmission line and a second transmission line connected to the radiation body and formed in a mesh structure, and a first signal pad and a second signal pad which are respectively connected to the first transmission line and the second transmission line and are formed in a bent shape with a solid structure.

15 Claims, 7 Drawing Sheets

ANTENNA ELEMENT, ANTENNA DEVICE AND DISPLAY DEVICE INCLUDING THE SAME

CROSS-REFERENCE TO RELATED APPLICATION(S)

This application claims priority to Korean Patent Application No. 10-2020-0146958 filed on Nov. 5, 2020 in the Korean Intellectual Property Office (KIPO), the entire disclosure of which is incorporated by reference herein.

BACKGROUND

1. Field of the Invention

The present invention relates to an antenna element, an antenna device and a display device including the same.

2. Description of the Related Art

Recently, according to development of the information-oriented society, wireless communication techniques such as Wi-Fi, Bluetooth, and the like are implemented, for example, in a form of smartphones by combining with display devices. In this case, an antenna may be coupled to the display device to perform a communication function.

Recently, with mobile communication techniques becoming more advanced, it is necessary for an antenna for performing communication in high frequency or ultra high frequency bands to be coupled to the display device. In addition, according to development of thin, high-transparency and high-resolution display devices such as a transparent display and a flexible display, it is necessary to develop an antenna so as to also have improved transparency and flexibility.

As the size of a screen in the display device is increased, a space or area of a bezel part or light-shielding part has been decreased. In this case, the space or area in which the antenna can be embedded is also limited, and thereby, a radiation body included in the antenna to transmit and receive signals may be overlapped with a display region of the display device. Accordingly, an image of the display device may be hidden by the radiation body of the antenna or the radiation body may be viewed by a user, thereby causing a deterioration in image quality.

Meanwhile, a dual polarized antenna is an antenna having two polarized waves at a predetermined angle, unlike a general single polarized antenna having only vertically or horizontally polarized waves, and is emerging as a technique capable of reducing installation costs and operation and maintenance costs in a mobile communication system.

Therefore, it is necessary to design a dual polarization antenna for implementing high-frequency communication in a limited space without being viewed by the user.

SUMMARY

It is an object of the present invention to an antenna element, an antenna device and a display device including the same.

To achieve the above objects, the following technical solutions are adopted in the present invention.

1. An antenna element including: a radiation body formed in a mesh structure; a first transmission line and a second transmission line which are connected to the radiation body and formed in a mesh structure; and a first signal pad and a second signal pad which are respectively connected to the first transmission line and the second transmission line and are formed in a bent shape with a solid structure.

2. The antenna element according to the above 1, wherein the first transmission line extends in a first direction to be connected to the radiation body, and the second transmission line extends in a second direction to be connected to the radiation body.

3. The antenna element according to the above 2, wherein the first direction and the second direction intersect each other.

4. The antenna element according to the above 3, wherein an angle between the first direction and the second direction is 80° to 100°.

5. The antenna element according to the above 2, wherein the first signal pad includes a first segment extending in a longitudinal direction of the antenna element and a second segment extending from the first segment in the first direction to be connected to the first transmission line, and the second signal pad includes a third segment extending in the longitudinal direction of the antenna element and a fourth segment extending from the third segment in the second direction to be connected to the second transmission line.

6. The antenna element according to the above 1, wherein the radiation body has a rhombus shape, and the first transmission line and the second transmission line are respectively connected to two adjacent sides of the radiation body.

7. The antenna element according to the above 6, wherein the first transmission line and the second transmission line are connected to a center of each side.

8. The antenna element according to the above 1, wherein the radiation body has a rectangular shape, and the first transmission line and the second transmission line are respectively connected to two adjacent vertices of the radiation body.

9. The antenna element according to the above 1, wherein the antenna element includes a visual region and a non-visual region, the radiation body, the first transmission line and the second transmission line are disposed in the visual region, and the first signal pad and the second signal pad are disposed in the non-visual region.

10. The antenna element according to the above 9, wherein the first signal pad and the second signal pad are disposed in a manner that: they cross a first line spaced 0.5 mm away from a boundary line between the visual region and the non-visual region toward the non-visual region in the longitudinal direction of the antenna element; and does not cross a second line spaced 0.5 mm from the boundary line toward the visual region.

11. The antenna element according to the above 1, wherein the first transmission line and the second transmission line are formed symmetrically based on a center line of the radiation body.

12. The antenna element according to the above 1, wherein the first signal pad and the second signal pad are formed symmetrically based on a center line of the radiation body.

13. The antenna element according to the above 1, further comprising a ground pad disposed around the first signal pad and the second signal pad to be separated from the first signal pad and the second signal pad.

14. The antenna element according to the above 13, wherein the ground pad includes: a first ground pad and a second ground pad disposed to face each other with the first signal pad and the second signal pad interposed therebetween; and a third ground pad disposed between the first signal pad and the second signal pad.

15. The antenna element according to the above 1, further comprising a dummy pattern disposed around the radiation electrode, the first transmission line and the second transmission line to be separated from the radiation electrode, the first transmission line and the second transmission line.

16. An antenna device including: the antenna element according to the above 1; a circuit board including circuit wirings connected to the first signal pad and the second signal pad; and an antenna driving unit disposed on the circuit board and connected to the circuit wirings.

17. A display device comprising the antenna element according to the above 1.

The antenna element according to an embodiment may include a radiation body and two transmission lines connected to the radiation body and orthogonal to each other. Therefore, it is possible to implement a dual polarization antenna.

In the antenna element according to an embodiment, a straight portion on a current path may be formed in a mesh structure, and a bent portion may be formed in a solid structure. The transmission line having a mesh structure connected to the radiation body is formed in a straight line and the signal pad having a solid structure connected to the transmission line is formed to be bent, such that it is possible to minimize a signal loss due to bending in the current path.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
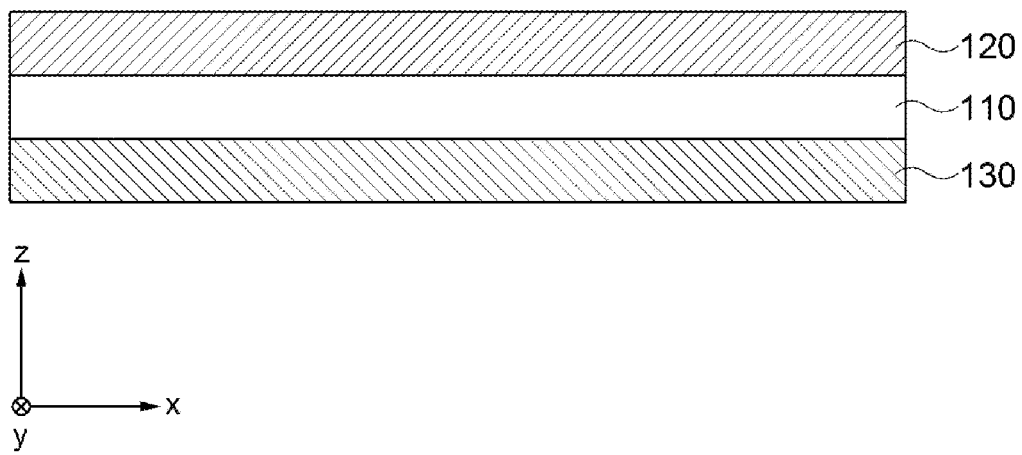
FIG. 1 is a schematic cross-sectional view illustrating an antenna element according to an embodiment.

Hereinafter, preferred embodiments of the present invention will be described in detail with reference to the accompanying drawings. However, since the drawings attached to the present disclosure are only given for illustrating one of preferable various embodiments of present invention to easily understand the technical spirit of the present invention with the above-described invention, it should not be construed as limited to such a description illustrated in the drawings.

An antenna element described in the present disclosure may be a patch antenna or a microstrip antenna manufactured in a form of a transparent film. For example, the antenna element may be applied to electronic devices for high frequency or ultra high frequency (e.g., 3G, 4G, 5G or more) mobile communication, Wi-Fi, Bluetooth, near field communication (NFC), global positioning system (GPS), and the like, but it is not limited thereto. Herein, the electronic device may include a mobile phone, a smart phone, a tablet, a laptop computer, a personal digital assistant (PDA), a portable multimedia player (PMP), a navigation device, an MP3 player, a digital camera, a wearable device and the like. The wearable device may include a wristwatch type, a wrist band type, a ring type, a belt type, a necklace type, an ankle band type, a thigh band type, a forearm band type wearable device or the like. However, the electronic device is not limited to the above-described example, and the wearable device is also not limited to the above-described example. In addition, the antenna element may be applied to various objects or structures such as vehicles and buildings.

In the following drawings, two directions which are parallel to an upper surface of a dielectric layer and intersect each other perpendicularly are defined as an x direction and a y direction, and a direction perpendicular to the upper surface of the dielectric layer is defined as a z direction. For example, the x direction may correspond to a width direction of the antenna element, the y direction may correspond to a length direction of the antenna element, and the z direction may correspond to a thickness direction of the antenna element.

FIG. 1 is a schematic cross-sectional view illustrating an antenna element according to an embodiment.

Referring to FIG. 1, an antenna element 100 according to an embodiment may include a dielectric layer 110 and an antenna conductive layer 120.

The dielectric layer 110 may include an insulation material having a predetermined dielectric constant. According to an embodiment, the dielectric layer 110 may include an inorganic insulation material such as glass, silicon oxide, silicon nitride, or metal oxide, or an organic insulation material such as an epoxy resin, an acrylic resin, or an imide resin. The dielectric layer 110 may function as a film substrate of the antenna element 100 on which the antenna conductive layer 120 is formed.

According to an embodiment, a transparent film may be provided as the dielectric layer 110. In this case, the transparent film may include a polyester resin such as polyethylene terephthalate, polyethylene isophthalate, polyethylene naphthalate, polybutylene terephthalate, etc.; a cellulose resin such as diacetyl cellulose, triacetyl cellulose, etc.; a polycarbonate resin; an acrylic resin such as polymethyl (meth)acrylate, polyethyl (meth)acrylate, etc.; a styrene resin such as polystyrene, acrylonitrile-styrene copolymer, etc.; a polyolefin resin such as polyethylene, polypropylene, cyclic polyolefin or polyolefin having a norbornene structure, ethylene-propylene copolymer, etc.; a vinyl chloride resin; an amide resin such as nylon, aromatic polyamide; an imide resin; a polyether sulfonic resin; a sulfonic resin; a polyether ether ketone resin; a polyphenylene sulfide resin; a vinylalcohol resin; a vinylidene chloride resin; a vinylbutyral resin; an allylate resin; a polyoxymethylene resin; a thermoplastic resin such as an epoxy resin and the like. These compounds may be used alone or in combination of two or more thereof. In addition, a transparent film made of a thermosetting resin or an ultraviolet curable resin such as (meth)acrylate, urethane, acrylic urethane, epoxy, silicone, and the like may be used as the dielectric layer 110.

According to an embodiment, an adhesive film such as an optically clear adhesive (OCA), an optically clear resin (OCR), and the like may also be included in the dielectric layer 110.

According to an embodiment, the dielectric layer 110 may be formed in a substantial single layer, or may be formed in a multilayer structure of two or more layers.

Capacitance or inductance may be generated by the dielectric layer 110, thus to adjust a frequency band which can be driven or sensed by the antenna element 100. When the dielectric constant of the dielectric layer 110 exceeds about 12, a driving frequency is excessively reduced, such that driving of the antenna in a desired high frequency band may not be implemented. Therefore, according to an embodiment, the dielectric constant of the dielectric layer 110 may be adjusted in a range of about 1.5 to 12, and preferably about 2 to 12.

According to an embodiment, an insulation layer (e.g., an encapsulation layer, a passivation layer, etc. of a display panel) inside the display device on which the antenna element 100 is mounted may be provided as the dielectric layer 110.

The antenna conductive layer 120 may be disposed on an upper surface of the dielectric layer 110.

The antenna conductive layer 120 may include a low resistance metal such as silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), or an alloy including at least one thereof. These may be used alone or in combination of two or more thereof. For example, the antenna conductive layer 120 may include silver (Ag) or a silver alloy (e.g., a silver-palladium-copper (APC) alloy) to implement a low resistance. As another example, the antenna conductive layer 120 may include copper (Cu) or a copper alloy (e.g., a copper-calcium (CuCa) alloy) in consideration of low resistance and fine line width patterning.

According to an embodiment, the antenna conductive layer 120 may include a transparent conductive oxide such as indium tin oxide (ITO), indium zinc oxide (IZO), indium zinc tin oxide (IZTO), zinc oxide (ZnOx), or copper oxide (CuO).

According to an embodiment, the antenna conductive layer 120 may include a lamination structure of a transparent conductive oxide layer and metal layer, for example, may have a two-layer structure of transparent conductive oxide layer-metal layer or a three-layer structure of transparent conductive oxide layer-metal layer-transparent conductive oxide layer. In this case, resistance may be reduced to improve signal transmission speed while improving flexible properties by the metal layer, and corrosion resistance and transparency may be improved by the transparent conductive oxide layer.

According to an embodiment, the antenna conductive layer 120 may be subjected to blackening treatment. For example, the surface of the antenna conductive layer 120 may be subjected to thermal oxidization, thereby reducing reflectance. Accordingly, it is possible to reduce the pattern from being viewed due to light reflection on the surface of the antenna conductive layer 120.

A surface portion of a metal layer of the antenna conductive layer 120 may be subjected to blackening treatment to form a blackened layer in which a portion of the metal layer is made of metal oxide or metal sulfide. Further, a blackened layer such as a coating film of a black material, or a plating layer of metal such as nickel and chromium may be formed on the metal layer.

The blackened layer is intended to improve transparency and visibility of the metal layer by reducing the reflectance of the metal layer, and may include, for example, at least one of silicon oxide, metal oxide, copper, molybdenum, carbon, tin, chromium, nickel and cobalt.

The composition and thickness of the blackened layer may be variously adjusted according to a desired degree of blackening.

Specific details of the antenna conductive layer 120 will be described below with reference to FIGS. 2 to 5.

According to an embodiment, the antenna element 100 may further include a ground layer 130. Since the antenna element 100 includes the ground layer 130, vertical radiation characteristics may be implemented.

The ground layer 130 may be disposed on a lower surface of the dielectric layer 110. The ground layer 130 may be overlapped with the antenna conductive layer 120 with the dielectric layer 110 interposed therebetween. For example, the ground layer 130 may be entirely overlapped with a radiation body (see 210 of FIG. 2) of the antenna conductive layer 120.

According to an embodiment, a conductive member of the display device or display panel on which the antenna element 100 is mounted may be provided as the ground layer 130. For example, the conductive member may include electrodes or wirings such as a gate electrode, source/drain electrodes, pixel electrode, common electrode, data line, scan line, etc. of a thin film transistor (TFT) included in the display panel; and a stainless steel (SUS) plate, heat radiation sheet, digitizer, electromagnetic wave shielding layer, pressure sensor, fingerprint sensor, etc. of the display device.

Figure 2:
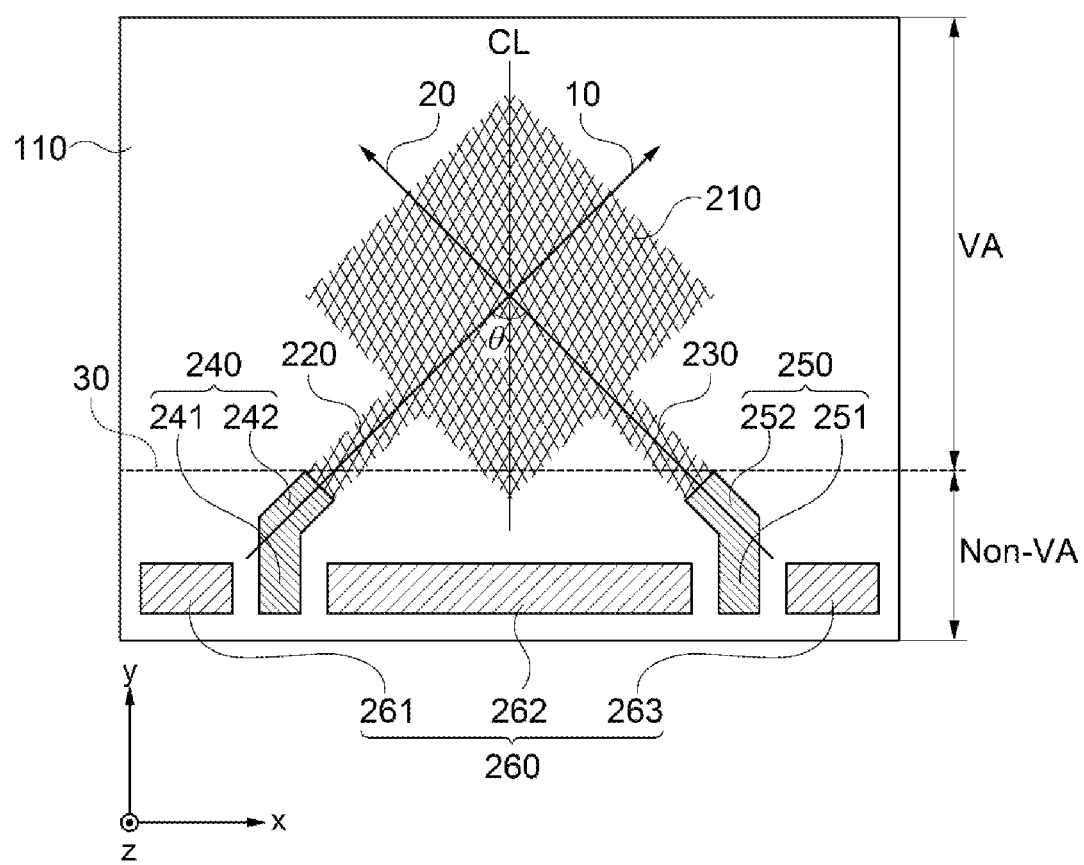
FIG. 2 is a schematic plan view of an antenna element according to an embodiment.
Figure 3:
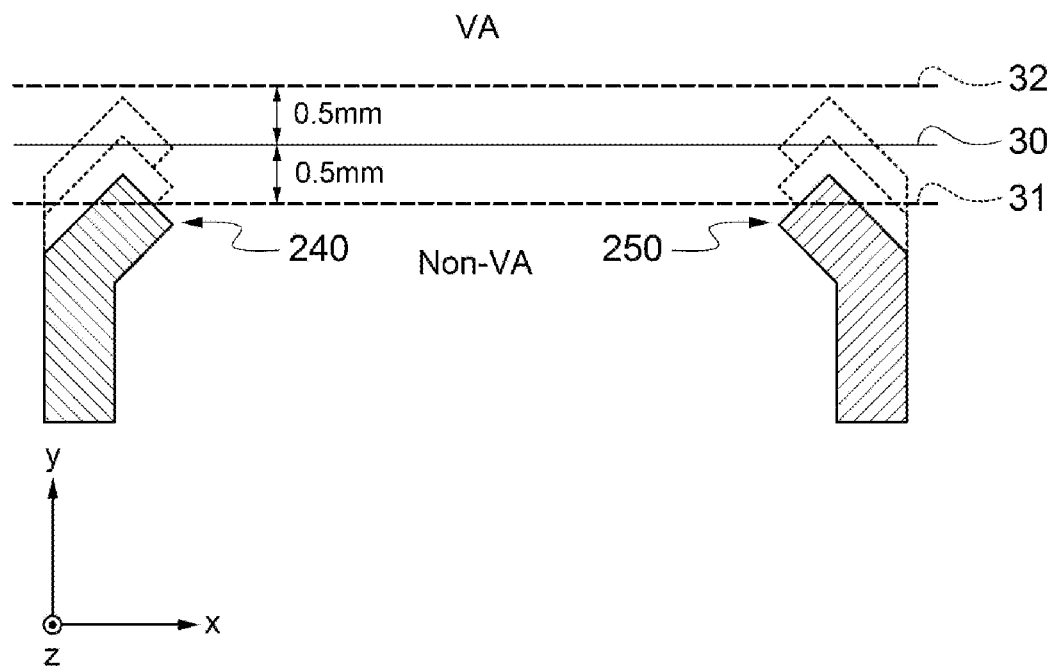
FIG. 3 is a view for describing arrangement positions of signal pads.

FIG. 2 is a schematic plan view of an antenna element according to an embodiment, and FIG. 3 is a view for describing arrangement positions of signal pads. An antenna element 100a shown in FIG. 2 may be an embodiment of the antenna element 100 shown in FIG. 1

Referring to FIGS. 2 and 3, the antenna element 100a according to an embodiment includes an antenna conductive layer 120 disposed on the dielectric layer 110, and the antenna conductive layer 120 may include a radiation body 210, a first transmission line 220, a second transmission line 230, and a first signal pad 240 and a second signal pad 250.

The first radiation body 210 may be formed on the dielectric layer 110 in a mesh structure. Thereby, transmittance of the first radiation body 210 may be increased, and flexibility of the antenna element 100a may be improved. Therefore, the antenna element 100a may be effectively applied to a flexible display device, while preventing the antenna element from being viewed even if it exists in a display region of the display device.

A length and a width of the radiation body 210 may be determined depending on a desired resonance frequency, radiation resistance and gain.

The radiation body 210 may be electrically connected to the first transmission line 220 and the second transmission line 230 to be supplied with a power through the first transmission line 220 and/or the second transmission line 230. Specifically, the radiation body 210 may receive an electric signal from the first transmission line 220 and/or the second transmission line 230, convert it into an electromagnetic wave signal, and radiate the converted electromagnetic wave signal. In addition, the radiation body 210 may receive an electromagnetic wave signal and convert it into an electrical signal.

According to an embodiment, as shown in FIG. 2, the radiation body 210 may be implemented in a rhombus shape, but this is only an embodiment, and it is not limited thereto.

The first transmission line 220 may extend from the first signal pad 240 in a first direction 10 on the dielectric layer 110 to be connected to the radiation body 210, and the second transmission line 230 may extend from the second signal pad 250 in a second direction 20 on the dielectric layer 110 to be connected to the radiation body 210. Thereby, the first transmission line 220 may electrically connect the first signal pad 240 and the radiation body 210, and the second transmission line 230 may electrically connect the second signal pad 250 and the radiation body 210.

The first direction 10 and the second direction 20 may be parallel to the upper surface of the dielectric layer 110 and may intersect the y direction (a longitudinal direction of the antenna element). In addition, the first direction 10 and the second direction 20 may intersect each other. For example, an angle θ formed by the first direction 10 and the second direction 20 may be 80° to 100°, and preferably 90°. By forming the extending directions of the first transmission line 220 and the second transmission line 230 to be orthogonal to each other, the dual polarization antenna may be effectively implemented.

According to an embodiment, as shown in FIG. 2, when the radiation body 210 is formed in a rhombus shape, the first transmission line 220 and the second transmission line 230 may be respectively connected to two adjacent sides of the radiation body 210. In this case, the first transmission line 220 and the second transmission line 230 may be connected to a center of each side.

The first transmission line 220 and the second transmission line 230 may include substantially the same conductive material as the radiation body 210. In addition, the first transmission line 220 and the second transmission line 230 may be formed as a substantial single member by integrally connecting with the radiation body 210, or may be formed as a separate member from the radiation body 210.

The first transmission line 220 and the second transmission line 230 may be formed in a mesh structure. For example, these transmission lines may be formed in a mesh structure having substantially the same shape (e.g., the same line width, the same interval, etc.) as the radiation body 210, or may be formed in a mesh structure having a substantially different shape from the radiation body 210.

The first transmission line 220 and the second transmission line 230 may be formed symmetrically based on a center line CL of the radiation body 210. In this case, the center line CL of the radiation body 210 may be defined as an imaginary line passing through the center of the radiation body 210 and bisecting the radiation body 210. As shown in FIG. 2, the center line CL may extend in they direction (longitudinal direction of the antenna element).

The first signal pad 240 may be connected to the first transmission line 220 and may be electrically connected to the radiation body 210 through the first transmission line 220. The second signal pad 250 may be connected to the second transmission line 230 and may be electrically connected to the radiation body 210 through the second transmission line 230. Thereby, the first signal pad 240 may electrically connect an antenna driving unit (e.g., a radio frequency integrated circuit (RFIC), etc.) and the radiation body 210, and the second signal pad 250 may electrically connect the antenna driving unit and the radiation body 210. For example, the flexible printed circuit board (FPCB) may be bonded to the first signal pad 240 and the second signal pad 250, and a transmission line of the FPCB may be connected to the first signal pad 240 and the second signal pad 250. For example, the first signal pad 240 and the second signal pad 250 may be electrically connected to the FPCB using an anisotropic conductive film (ACF) bonding technique, which is a bonding method that allows electrical conduction up and down and insulates left and right using an anisotropic conductive film (ACF), or using a coaxial cable, but it is not limited thereto. The antenna driving unit may be mounted on the FPCB or a separate printed circuit board (PCB) to be electrically connected to the transmission line of the FPCB. Accordingly, the radiation body 210 and the antenna driving unit may be electrically connected.

The first signal pad 240 and the second signal pad 250 may be bent. For example, the first signal pad 240 may include a first segment 241 and a second segment 242. The first segment 241 may extend in the y direction (longitudinal direction of the antenna element) to be connected to the second segment 242, and the second segment 242 may extend from the first segment 241 in the first direction 10 to be connected to the first transmission line 220 have. Similarly, the second signal pad 250 may include a third segment 251 and a fourth segment 252. The third segment 251 may extend in the y direction (longitudinal direction of the antenna element) to be connected to the fourth segment 252, and the fourth segment 252 may extend from the third segment 251 in the second direction 20 to be connected to the second transmission line 230.

According to an embodiment, the first signal pad 240 and the second signal pad 250 may include substantially the same conductive material as the first transmission line 220 and the second transmission line 230. In addition, the first signal pad 240 and the second signal pad 250 may be formed as a substantial single member by integrally connecting with the first transmission line 220 and the second transmission line 230, respectively, or may be formed as separate members from the first transmission line 220 and the second transmission line 230.

According to an embodiment, the first signal pad 240 and the second signal pad 250 may be formed in a solid structure. When implementing an antenna having two transmission lines for dual polarization, the two transmission lines may be bent. Such bending of the transmission line causes a loss in a signal, and in particular, when forming the transmission line in a mesh structure, the loss in the signal is increased. In order to minimize such signal loss, in the antenna element according to an embodiment, a straight portion on a current path may be formed in a mesh structure, and a bent portion may be formed in a solid structure. That is, the transmission lines 220 and 230 having a mesh structure connected to the radiation body 210 are formed in a straight line, and the signal pads 240 and 250 having a solid structure connected to the transmission lines 220 and 230 are formed to be bent, such that it is possible to prevent the signal loss due to bending of the mesh structure line The first signal pad 240 and the second signal pad 250 may be formed symmetrically based on the center line CL of the radiation body 210 similar to the first transmission line 220 and the second transmission line 230.

According to an embodiment, the antenna conductive layer 120 may further include a ground pad 260.

The ground pad 260 may be disposed around the first signal pad 240 and the second signal pad 250 to be electrically and physically separated from the first signal pad 240 and the second signal pad 250. For example, the ground pad 260 may include a first ground pad 261 and a second ground pad 263 which are disposed to face each other in the x direction (a width direction of the antenna element) with the first signal pad 240 and the second signal pad 250 interposed therebetween, and a third ground pad 262 disposed between the first signal pad 240 and the second signal pad 250.

The ground pad 260 may be formed in a solid structure including the above-described metal or alloy.

Meanwhile, the antenna element 100a may include a visual region VA and a non-visual region Non-VA. Herein, the visual region VA may correspond to a display region of the display device in which one portion of the antenna element 100a is mounted, and the non-visual region Non-VA may correspond to a peripheral region of the display device in which the other portion of the antenna element 100a is mounted. The display region may indicate a region in which visual information is displayed, and the peripheral region may indicate opaque regions disposed on both sides and/or both ends of the display region. For example, the peripheral region may correspond to a light-shielding part or a bezel part of the display device.

The radiation body 210, the first transmission line 220 and the second transmission line 230 may be disposed in the visual region VA, and the first signal pad 240, the second signal pad 250 and the ground pad 260 may be disposed in the non-visual region Non-VA.

According to an embodiment, as shown in FIG. 3, the first signal pad 240 and the second signal pad 250 may be disposed in the non-visual region Non-VA so that they cross a first line 31 spaced 0.5 mm away from a boundary line 30 between the visual region VA and the non-visual region Non-VA toward the non-visual region Non-VA in the y direction (longitudinal direction of the antenna element), and does not cross a second line 32 spaced 0.5 mm from the boundary line 30 toward the visual region VA.

Meanwhile, FIG. 2 illustrates an example in which a portion of the radiation body 210 is disposed in the non-visual region Non-VA, but this is only an embodiment. That is, depending on the size, etc. of the radiation body 210 and/or the transmission lines 220 and 230, the radiation body 210 may be selectively disposed only in the visual region VA, and may not be disposed in the non-visual region Non-VA.

Figure 4:
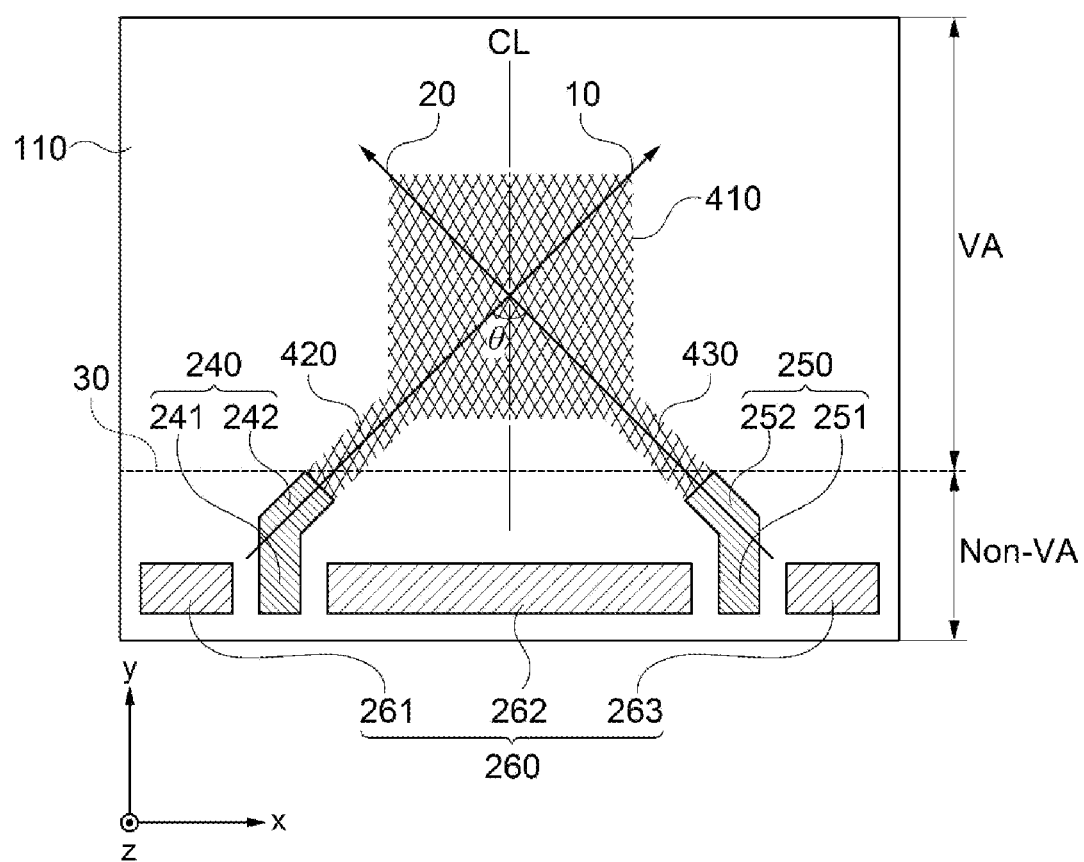
FIG. 4 is a schematic plan view of an antenna element according to another embodiment.

FIG. 4 is a schematic plan view of an antenna element according to another embodiment. An antenna element 100b shown in FIG. 4 may be another embodiment of the antenna element 100 shown FIG. 1. Details of the structure and configuration substantially the same as those described with reference to FIGS. 1 to 3 will not be described.

Referring to FIG. 4, a radiation body 410 may be implemented in a rectangular shape. The length and width of the radiation body 410 may be determined depending on the desired resonance frequency, radiation resistance and gain.

A first transmission line 420 may extend from the first signal pad 240 in the first direction 10 to be connected to the radiation body 410, and a second transmission line 430 may extend from the second signal pad 250 in the second direction 20 to be connected to the radiation body 410. Thereby, the first transmission line 420 may electrically connect the first signal pad 240 and the radiation body 410, and the second transmission line 430 may electrically connect the second signal pad 250 and the radiation body 210.

As described above, the first direction 10 and the second direction 20 may be parallel to the upper surface of the dielectric layer 110 and intersect the y direction (longitudinal direction of the antenna element). In addition, the first direction 10 and the second direction 20 may intersect each other. For example, the angle θ formed by the first direction 10 and the second direction 20 may be 80° to 100°, and preferably 90°. By forming the extending directions of the first transmission line 420 and the second transmission line 430 to be perpendicular to each other, the dual polarization antenna may be effectively implemented.

According to an embodiment, as shown in FIG. 4, when implementing the radiation body 410 in a rectangular shape, the first transmission line 420 and the second transmission line 430 may be respectively connected to two adjacent vertices of the radiation body 410.

Figure 5:
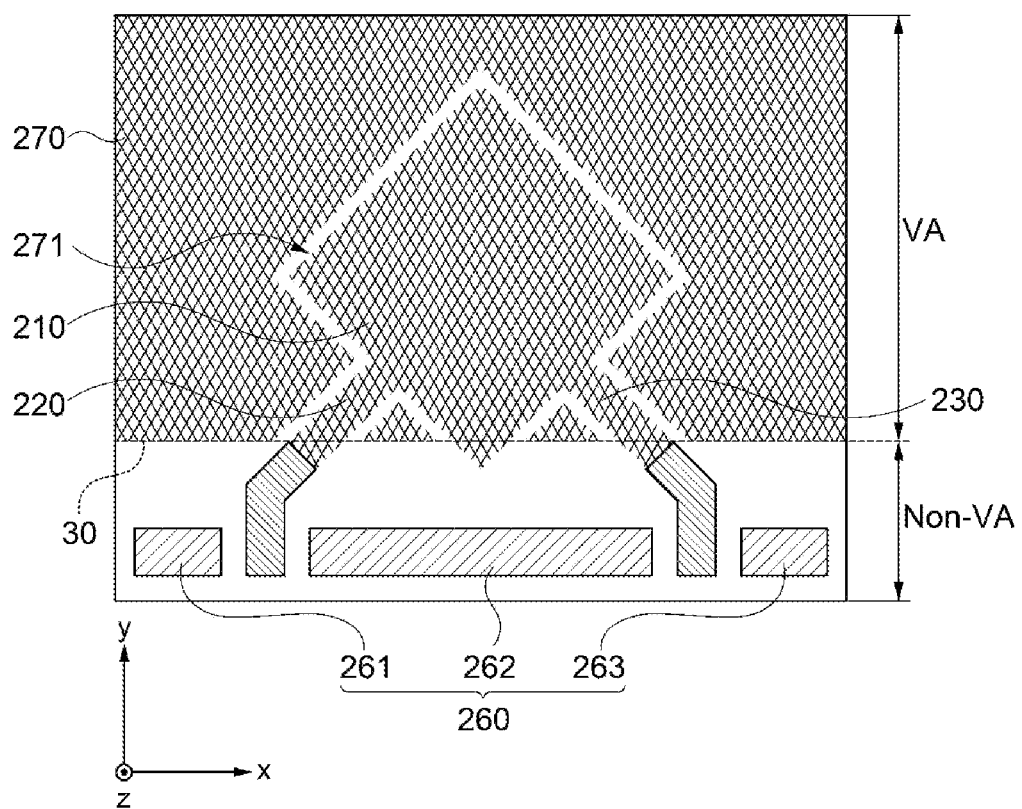
FIG. 5 is a schematic plan view of an antenna element according to another embodiment.

FIG. 5 is a schematic plan view of an antenna element according to another embodiment. An antenna element 100c shown in FIG. 5 may be another embodiment of the antenna element 100 shown FIG. 1. Details of the structure and configuration substantially the same as those described with reference to FIGS. 1 to 4 will not be described.

Referring to FIG. 5, the antenna element 100c may further include a dummy pattern 270.

The dummy pattern 270 may be disposed around the radiation body 210, the first transmission line 220, and the second transmission line 230.

The dummy pattern 270 may be formed in a mesh structure having substantially the same shape as at least one of the radiation body 210, the first transmission line 220 and the second transmission line 230. According to an embodiment, some of the conductive lines forming the mesh structure of the dummy pattern 270 may be segmented in order to secure antenna performance.

The dummy pattern 270 may be disposed in the visual region VA. According to an embodiment, the dummy pattern 270 is selectively disposed only in the visual region VA, and may not be disposed in the non-visual region Non-VA.

The dummy pattern 270 may be formed to be electrically and physically separated from the radiation body 210, the first transmission line 220 and the second transmission line 230. For example, the separation region 271 is formed along side lines or contours of the radiation body 210, the first transmission line 220, and the second transmission line 230, such that the dummy pattern 270 may be separated from the radiation body 210, the first transmission line 220, and the second transmission line 230.

As the dummy pattern 270 is disposed around the radiation body 210, the first transmission line 220 and the second transmission line 230, optical uniformity of the pattern in the visual region VA is improved, thereby it is possible to prevent the antenna pattern from being viewed.

Meanwhile, a plurality of antenna elements 100a, 100b, and 100c described in FIGS. 1 to 5 may be arranged linearly or non-linearly to form an antenna array. In this case, a separation distance between the radiation bodies may be half (2l2) or more of a wavelength corresponding to the resonance frequency of the radiation body in order to minimize radiation interference from the respective radiation bodies.

Figure 6:
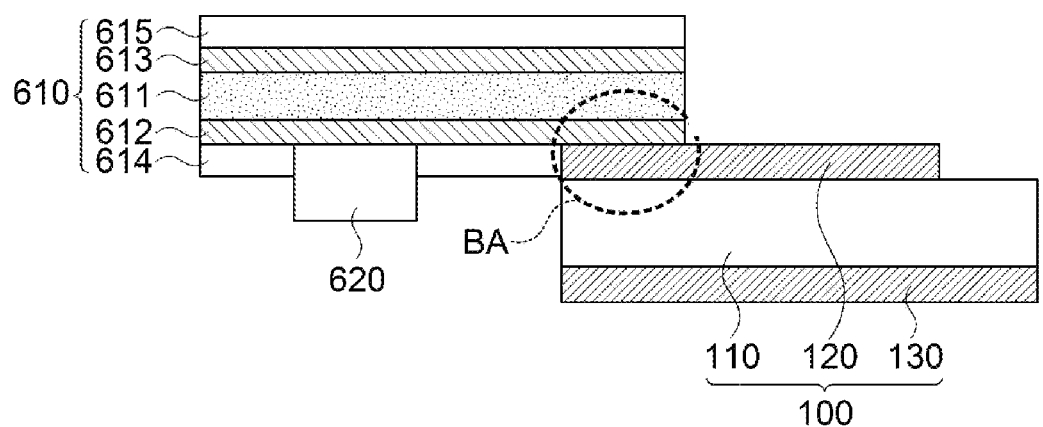
FIG. 6 is a schematic cross-sectional view illustrating an antenna device according to an embodiment.

FIG. 6 is a schematic cross-sectional view illustrating an antenna device according to an embodiment.

Referring to FIG. 6, the antenna device according to an embodiment may include the antenna element 100, a circuit board 610, and an antenna driving unit 620. Herein, the antenna element 100 is the same as described above with reference to FIGS. 1 to 5, therefore it will not be described in detail.

The antenna element 100 may be adhered or bonded to an external circuit structure in a bonding area BA. The external circuit structure may include the circuit board 610 and a conductive relay structure.

The circuit board 610 may be disposed on the antenna conductive layer 120. According to an embodiment, the circuit board 610 may be a flexible printed circuit board (FPCB).

The circuit board 610 may include a core layer 611, a circuit wiring 612, and a power supply ground 613. An upper coverlay film 615 and a lower coverlay film 614 for protecting wirings may be respectively formed on upper and lower surfaces of the core layer 611.

The core layer 611 may include a resin material having flexibility, such as polyimide, epoxy resin, polyester, cyclo olefin polymer (COP), liquid crystal polymer (LCP) and the like. The circuit wiring 612 may be disposed on, for example, one surface (e.g., the lower surface) of the core layer 611. The circuit wiring 612 may be provided as a wiring for distributing power from the antenna driving unit 620 to the antenna conductive layer 120 or the radiation bodies 210 and 410.

According to an embodiment, the circuit wiring 612 may be electrically connected to the first signal pad 240 and the second signal pad 250 of the antenna conductive layer 120. For example, the circuit wiring 612 may be electrically connected to the signal pads 240 and 250 through the conductive relay structure interposed between the circuit wiring 612 and the signal pads 240 and 250. For example, the lower coverlay film 614 may be partially cut or removed to expose a portion of the circuit wiring 612 to be bonded to the antenna conductive layer 120 in the bonding area BA. The exposed portion of the circuit wiring 612 and the antenna conductive layer 120 may be press bonded through the conductive relay structure.

The conductive relay structure may be made of, for example, an anisotropic conductive film (ACF). In this case, the conductive relay structure may include conductive particles (e.g., silver particles, copper particles, carbon particles, or the like) dispersed in the resin layer.

The circuit wiring 612 may include a first circuit wiring and a second circuit wiring. The first circuit wiring may electrically connect the antenna driving unit 620 and the first signal pad 240. The second circuit wiring may electrically connect the antenna driving unit 620 and the second signal pad 250. By adjusting the lengths of the first circuit wiring and the second circuit wiring, the retardation between input signals supplied to the radiation bodies 210 and 410 may be controlled. For example, the first circuit wiring may be formed in a straight line, and the second circuit wiring may be formed to have one or more bent portions to make a difference in the length.

The power supply ground 613 may be disposed on the other surface (e.g., the upper surface) of the core layer 611. The power supply ground 613 may have a line shape or a plate shape. The power supply ground 613 may function as a barrier for shielding or suppressing noise or self-radiation generated from the circuit wiring 612.

According to an embodiment, the power supply ground 613 may be electrically connected to the ground pad 260 (see FIG. 2) of the antenna conductive layer 120 through a ground via (not illustrated) penetrating the core layer 611.

The antenna driving unit 620 may be disposed on the circuit board 610. The antenna driving unit 620 may be a radio frequency integrated circuit (RFIC).

Power may be supplied from the antenna driving unit 620 to the antenna conductive layer 120 through the circuit wiring 612. For example, a circuit or a contact for electrically connecting the antenna driving unit 620 and the circuit wiring 612 may be included in the circuit board 610.

The antenna driving unit 620 may apply a first input signal and a second input signal to the first signal pad 240 and the second signal pad 250, respectively, through the circuit wiring 612. In addition, the antenna driving unit 620 may control the phases of the first input signal and the second input signal.

The antenna driving unit 620 may control a time of applying the first input signal and the second input signal. For example, the antenna driving unit 620 may alternately apply the first input signal and the second input signal in turn.

Meanwhile, FIG. 6 illustrates an example in which the antenna driving unit 620 is mounted on the circuit board 610, but this is only an embodiment. That is, the antenna driving unit 620 may be mounted on other circuit board connected to the circuit board 610. In this case, the other circuit board may be a circuit board of the display device or display panel on which the antenna device is mounted.

Figure 7:
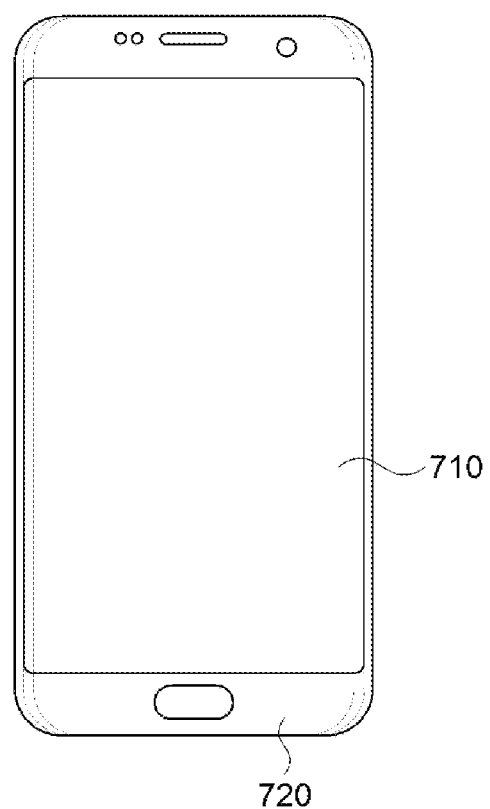
FIG. 7 is a schematic plan view illustrating a display device according to an embodiment.

FIG. 7 is a schematic plan view illustrating a display device according to an embodiment. More specifically, FIG. 7 is a view illustrating an external shape including a window of the display device.

Referring to FIG. 7, a display device 700 may include a display region 710 and a peripheral region 720.

The display region 710 may indicate a region in which visual information is displayed, and the peripheral region 720 may indicate opaque regions disposed on both sides and/or both ends of the display region 710. For example, the peripheral region 720 may correspond to the light-shielding part or the bezel part of the display device 700.

According to an embodiment, the above-described antenna elements 100, 100a, 100b and 100c may be mounted on the display device 700. For example, the visual regions VA of the antenna elements 100, 100a, 100b, and 100c may be disposed to correspond to the display region 710, and the non-visual regions Non-VA may be disposed to correspond to the peripheral region 720.

The circuit board 610 may be disposed in the peripheral region 720 together with the antenna driving unit 620. By disposing the signal pads 240 and 250 of the antenna elements 100, 100a, 100b, and 100c adjacent to the antenna driving unit 620, signal loss may be suppressed by shortening a path for transmitting and receiving signals.

The antenna elements 100, 100a, 100b and 100c include the radiation bodies 210 and 410, the transmission lines 220, 230, 420 and 430 and/or the dummy pattern 270, which are formed in a mesh structure, such that it is possible to significantly reduce or suppress the pattern from being viewed while improving the transmittance. Accordingly, image quality in the display region 710 may also be improved while maintaining or improving desired communication reliability.

The present invention has been described with reference to the preferred embodiments above, and it will be understood by those skilled in the art that various modifications may be made within the scope without departing from essential characteristics of the present invention. Accordingly, it should be interpreted that the scope of the present invention is not limited to the above-described embodiments, and other various embodiments within the scope equivalent to those described in the claims are included within the present invention.

What is claimed is:

1. An antenna element comprising:
   a dielectric layer;
   a radiation body formed in a first mesh structure on the dielectric layer;
   a first transmission line and a second transmission line which are connected to the radiation body and formed in a second mesh structure; and
   a first signal pad and a second signal pad which are respectively connected to the first transmission line and the second transmission line and are formed in a bent shape with a solid structure;

wherein the first transmission line extends in a first direction to be connected to the radiation body, and the second transmission line extends in a second direction to be connected to the radiation body, and wherein the first direction and the second direction intersect each other.

2. The antenna element according to claim 1, wherein an angle between the first direction and the second direction is 80° to 100°.

3. The antenna element according to claim 1, wherein the radiation body has a rhombus shape; and the first transmission line and the second transmission line are respectively connected to two adjacent sides of the radiation body.

4. The antenna element according to claim 3, wherein the first transmission line and the second transmission line are connected to a center of each side.

5. The antenna element according to claim 1, wherein the radiation body has a rectangular shape; and the first transmission line and the second transmission line are respectively connected to two adjacent vertices of the radiation body.

6. The antenna element according to claim 1, wherein the antenna element comprises a visual region and a non-visual region;

the radiation body, the first transmission line and the second transmission line are disposed in the visual region; and the first signal pad and the second signal pad are disposed in the non-visual region.

7. The antenna element according to claim 6, wherein the first signal pad and the second signal pad are disposed in a manner that:

they cross a first line spaced 0.5 mm away from a boundary line between the visual region and the non-visual region toward the non-visual region in the longitudinal direction of the antenna element; and does not cross a second line spaced 0.5 mm from the boundary line toward the visual region.

8. The antenna element according to claim 1, wherein the first transmission line and the second transmission line are formed symmetrically based on a center line of the radiation body.

9. The antenna element according to claim 1, wherein the first signal pad and the second signal pad are formed symmetrically based on a center line of the radiation body.

10. The antenna element according to claim 1, further comprising a dummy pattern disposed around the radiation body, the first transmission line and the second transmission line, wherein the dummy pattern is separated from the radiation body, the first transmission line and the second transmission line.

11. An antenna device comprising:

the antenna element according to claim 1;

a circuit board including circuit wirings connected to the first signal pad and the second signal pad; and an antenna driving unit disposed on the circuit board and connected to the circuit wirings.

12. A display device comprising the antenna element according to claim 1.

13. An antenna element comprising:

a dielectric layer;

a radiation body formed in a first mesh structure on the dielectric layer;

a first transmission line and a second transmission line which are connected to the radiation body and formed in a second mesh structure; and a first signal pad and a second signal pad which are respectively connected to the first transmission line and the second transmission line and are formed in a bent shape with a solid structure;

wherein the first transmission line extends in a first direction to be connected to the radiation body, and the second transmission line extends in a second direction to be connected to the radiation body, wherein the first signal pad includes a first segment extending in a longitudinal direction of the antenna element and a second segment extending from the first segment in the first direction to be connected to the first transmission line, and wherein the second signal pad includes a third segment extending in the longitudinal direction of the antenna element and a fourth segment extending from the third segment in the second direction to be connected to the second transmission line.

14. An antenna element comprising:

a dielectric layer;

a radiation body formed in a first mesh structure on the dielectric layer;

a first transmission line and a second transmission line which are connected to the radiation body and formed in a second mesh structure;

a first signal pad and a second signal pad which are respectively connected to the first transmission line and the second transmission line and are formed in a bent shape with a solid structure; and a ground pad disposed around the first signal pad and the second signal pad to be separated from the first signal pad and the second signal pad.

15. The antenna element according to claim 14, wherein the ground pad comprises:

a first ground pad and a second ground pad disposed to face each other with the first signal pad and the second signal pad interposed therebetween; and a third ground pad disposed between the first signal pad and the second signal pad.

* * * * *